(12) United States Patent
Voisine et al.

(10) Patent No.: US 6,657,424 B1
(45) Date of Patent: Dec. 2, 2003

(54) DC LOAD DETECTION IN AN ELECTRIC UTILITY METER

(75) Inventors: John T. Voisine, Lafayette, IN (US); John P. Junker, Lafayette, IN (US)

(73) Assignee: Siemens Power Transmission & Distribution, Inc., Wendell, NC (US)

( * ) Notice: Subject to any disclaimer, the term of this patent is extended or adjusted under 35 U.S.C. 154(b) by 0 days.

(21) Appl. No.: 09/556,350

(22) Filed: Apr. 24, 2000

(51) Int. Cl.$^7$ .................... G01R 19/00; G01R 23/16; G01R 11/32
(52) U.S. Cl. ................. 324/76.11; 324/76.12; 324/142; 324/134
(58) Field of Search .................. 324/116, 103 P, 324/76.77, 76.11, 12, 107, 140, 141, 142, 134

(56) References Cited

U.S. PATENT DOCUMENTS

| | | |
|---|---|---|
| 4,970,459 A | 11/1990 | Germer et al. |
| 5,055,773 A | 10/1991 | Thomas et al. |
| 5,212,441 A | 5/1993 | McEachern et al. |
| 5,391,983 A | 2/1995 | Lusignan et al. |
| 5,461,306 A | 10/1995 | Niven |
| 5,471,137 A | 11/1995 | Briese et al. |
| 5,631,554 A * | 5/1997 | Briese et al. ............ 324/76.77 |
| 5,907,241 A | 5/1999 | Shuey et al. |

* cited by examiner

*Primary Examiner*—Kamand Cuneo
*Assistant Examiner*—Paresh Patel
(74) *Attorney, Agent, or Firm*—Maginot, Moore & Bowman

(57) ABSTRACT

An electricity meter includes a current sensor, an analog to digital (A/D) converter coupled to the current sensor, and a processor coupled to the A/D converter. The current sensor and the A/D converter cooperate to generate a digital current signal having a waveform representative of the current waveform on the power lines connected to the electricity meter. The processor is operable to analyze a digital current waveform signal produced by the current sensor and A/D converter to detect a rectified (DC) load. In particular, the processor perform analysis on the digital current signal to generate a peak positive current value and a peak negative current value, and then detect the presence of a rectified load coupled to the power network based on said peak positive current value and said peak negative current value.

18 Claims, 5 Drawing Sheets

DC LOAD DETECTION IN AN ELECTRIC UTILITY METER

FIELD OF THE INVENTION

The present invention relates generally to electrical utility meters, and in particular, to a system for the detection of rectified loads coupled to an electricity meter.

DESCRIPTION OF THE PRIOR ART

Electrical utility service providers, or simply utilities, monitor energy usage by customers through electrical utility meters or electricity meters. Electricity meters track the amount of energy consumed, typically measured in kilowatt-hours, at each customer's house or facility. The utility uses the consumption information primarily for billing, but also for resource allocation planning and other purposes.

Most utilities generate polyphase electrical power, and typically three phase power. Polyphase electrical power is alternating current electrical power that is supplied on a plurality of power supply lines wherein the voltage waveform as well as the current waveform on each of the power supply lines has a unique phase angle. Generally, only a single phase of the polyphase electrical power is typically provided for single family dwellings while true polyphase electrical power is typically provided to larger facilities such as commercial and industrial facilities.

Polyphase electrical power is provided to customers in a plurality of configurations known as service types. A service type is typically defined by the nominal voltage level and a wiring configuration. A wiring configuration is further defined by the number of wires (three wire or four wire) and the wiring relationship between the phases (wye or delta). A utility meter for polyphase electrical power may be found in allowed U.S. patent application Ser. No. 08/690,973 filed Aug. 1, 1996 by Bond et al. entitled Service Type Recognition in Electrical Utility Meter and specifically incorporated herein by reference. There are, however, many different types of electricity meters including analog, digital, and hybrid analog/digital meters.

A problem with many prior art electricity meters is that when a rectified or DC load is coupled to the electricity meter, the electricity meter cannot accurately measure and/or calculate energy usage. Rectified loads are loads in which at least a portion of the alternating current is rectified. Such loads are typically rare, but nevertheless cause may undesirable metering inaccuracies when they occur. If energy usage is not accurately measured, the utility company cannot equitably bill the user of that energy. Meters that use transformer-based current sensing devices, which are widely used in metering, are particularly vulnerable to inaccuracies due to rectified loads.

Prior art arrangements for detecting a DC component in an AC signal have been developed. U.S. Pat. No. 5,461,306 to Niven shows a DC current detection system for a current transformer that obtains current samples that are spaced apart by 180°. If the sum of the current samples are substantially zero, then the current waveform is assumed to be symmetric and, as a result, it is determined that no DC current is present. If, however, the sum of the current samples is not zero, then it is determined that a DC current component is present.

One drawback of the technique shown in U.S. Pat. No. 5,461,306 is that it obtains current samples based on the voltage waveform. In particular, the system detects the positive and negative peaks of the voltage waveform and then obtains the current samples that correspond to the detected voltage peaks. The drawback arises from the fact that the voltage peaks and the current peaks do not always coincide, particularly when a capacitive or inductive load is coupled to the system. Although it is still possible to perform the DC current analysis without using the peak current values, the analysis is more prone to error if the peak current values are not used.

What is therefore needed is a system for determining whether a rectified (DC) load is coupled to an electricity meter that is more accurate than the prior art systems. Accordingly, there is a need for a system that more accurately and/or consistently determines peak current values to determine the presence of a DC or half-wave rectified load.

SUMMARY OF THE INVENTION

The present invention provides a system, method and apparatus for detecting rectified (DC) loads in an electricity meter by analyzing the current waveform to obtain peak current values. As a result, potential metering inaccuracies due to rectified loads may be uncovered such that corrective action may be taken. Moreover, because the current signal itself is analyzed to generate the peak current values used in the half-wave rectified load determination, the determination is less prone to error than prior art systems.

According to one embodiment, there is provided an electricity meter having a current sensor, an analog to digital (A/D) converter coupled to the current sensor, and a processor coupled to the A/D converter. The current sensor and the A/D converter cooperate to generate a digital current signal having a waveform representative of the current waveform on the power lines connected to the electricity meter. The processor is operable to analyze a digital current waveform signal produced by the current sensor and A/D converter to detect a rectified (DC) load. In particular, the processor perform analysis on the digital current signal to generate a peak positive current value and a peak negative current value, and then detect the presence of a rectified load coupled to the power network based on said peak positive current value and said peak negative current value.

According to another embodiment, there is provided a method for detecting the presence of a rectified load coupled to an electricity meter. The method includes a first step of obtaining a current signal, the current signal representative of current in the electric power network. The method includes another step of performing analysis on the current signal to generate a peak positive current value and a peak negative current value. Then, it is determined whether a rectified load is coupled to the electric power network based on the peak positive current value and the peak negative current value. Finally, the method includes a step of providing an indication of the presence of a rectified load if it is determined that a rectified load is coupled to the electric power network.

The present invention thus provides a method and apparatus for detecting a DC or half-wave rectified load connected to an electricity meter, wherein the method and apparatus determine peak current values using analysis of the current signal itself. As a result, the present invention can determine the presence of a DC component using the more robust peak current values.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set forth herein illustrates one preferred embodiment of the invention, in one form, and such exemplification is not to be construed as limiting the scope of the invention in any manner.

DETAILED DESCRIPTION

Figure 1:
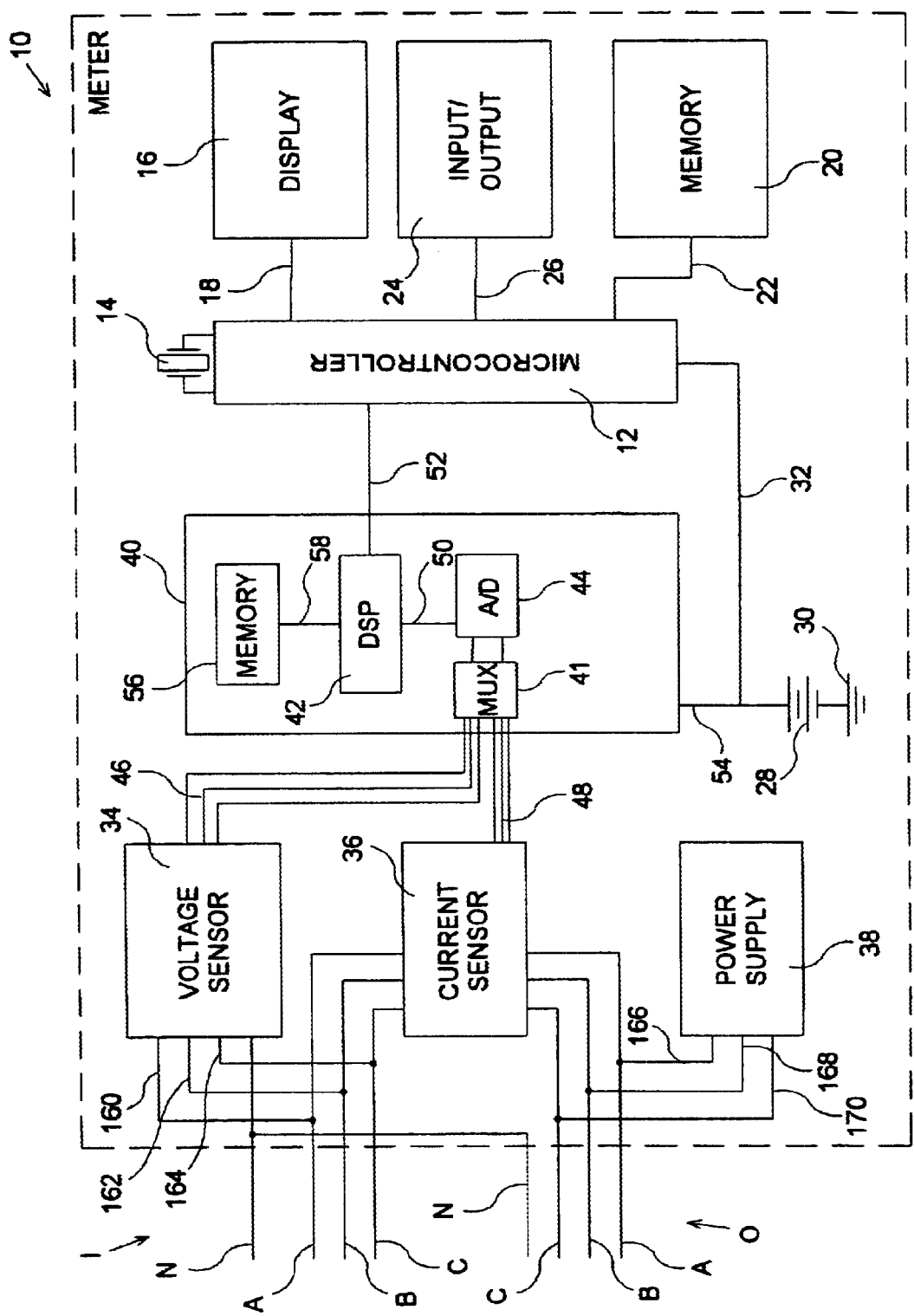
FIG. 1 is a block diagram of an electric utility meter embodying the present invention.

With reference now to FIG. 1, there is shown an electricity meter 10, preferably a solid-state polyphase electric power usage or Kilowatt/Kilowatt-hours ("KW/Kwh") meter. The electricity meter 10 includes a microcontroller or microprocessor 12 clocked at a predetermined frequency such as, for example, 5 MHz, by a crystal 14 or the like. The microcontroller 12 is in electrical communication with a display 16 via communication line 18. The display 16 is used to show various parameters of the meter 10 and/or various measured quantities by the meter 10 such as, accumulated watt-hours used, and is typically an LCD type display, although other types of displays may be used.

The microcontroller 12 is also in electrical communication with an input/output or communication (COM) port 24 via communication line 26. The I/O port 24 allows the import and export of data to the meter 10 and/or coupling to other devices or components. Additionally, microcontroller 12 is in electrical communication with a memory device 20 via a communication line 22. The memory 20 may take many forms such as, for example, volatile and/or non-volatile RAM or ROM, or any combination or hybrid thereof as necessary or desired. Further, microcontroller 12 is electrically coupled to a battery 28 via line 32 for providing backup power to the microcontroller and other components such as the memory 20. It should be understood that each communication line described herein may be any type of line or link that provides communication between the various devices and components such as, for example, a communications bus as is known in the art. The meter 10 also has an electrical ground 30 to which is electrically coupled the battery 28.

The meter 10 is interposed between a load or loads (not shown) and a source of electrical energy/power (not shown). Particularly, lines A, B, C and N respectively representing three phases (φ1, φ2, φ3) of alternating current (AC) electrical energy and neutral, emanate from the source of electrical energy/power (not shown) and are electrically coupled to the meter 10 at input I. Lines A, B, C, and N emanate from the meter 10 at output O, and are electrically coupled to the load(s) (not shown). It should be understood that although lines A, B, and C are characterized herein as collectively carrying three phase electrical power, and thus the meter 10 is adapted to measure and utilize three-phase electrical energy, the meter 10 may be adapted to measure and utilize single-phase or any other phase(s) of electrical energy. The principles of the present invention are applicable to any phase electrical energy.

The meter 10 includes a power supply 38, tapped into lines A, B, and C via tap lines 166, 168, and 170 respectively. The power supply 38 transforms the incoming electrical power into suitable direct current (DC) electrical power for operating the meter 10. Power for operation of the meter 10 is supplied through the power supply 38 when electrical power is provided on the lines A, B, and C. In situations where electrical power is not being supplied to the power supply 38 (e.g. during service interruption), the meter 10 utilizes a battery 28. The battery 28 is also the source of electrical power for powering the meter 10 when electrical utility power to the meter is interrupted. During a power interruption, the battery 28 allows the meter 10 to maintain a real-time clock to enable a smooth transition into operation when utility power is restored.

The meter 10 further includes a voltage sensor module 34 that is electrically tapped into the lines A, B, and C via tap lines 160, 162, and 164 respectively. The voltage sensor module 34 is electrically coupled to a processing module or unit 40 via communication line 46 for transmitting a voltage signal or voltage signals derived from the voltage sensor module 34 to the processing unit 40. The voltage sensor module 34 may derive a voltage signal from only one phase of the electrical energy or may derive multiple voltage signals, one for each phase, by suitable voltage detector(s) as are known in the art and which are in a voltage sensing relationship with the respective lines. The voltage sensor module 34 may suitably include one or more resistive divider networks.

The voltage sensor module 34 produces an analog voltage waveform or signal in response to the voltage of each line. The voltage sensor module 34 provides the analog voltage waveforms to the processing unit 40. The processing unit 40 may suitably include a multiplexer 41 that allows the processing unit 40 to process one analog voltage waveform at a time. To this end, the voltage sensor module 34 is in electrical communication with the processing unit 40 via communication lines 46. To process the analog voltage waveforms, the processing unit 40 includes an analog-to-digital (A/D) converter 44 in electrical communication with a digital signal processor (DSP) 42 via a communication line 50. The A/D converter 44 samples and digitizes the multiplexed analog voltage waveform signals.

The DSP 42 receives the digital voltage signals for processing. For reasons discussed further below, the DSP 42 of the processing unit 40 is in electrical communication with microcontroller 12 via communication line 52.

A current sensor module 36, as is known in the art, is interposed in the lines A, B, and C, and is electrically coupled to the processing module 40 via communication lines 48. The current sensor module 36 may include a current transformer for each line. The current transformer may suitably comprise a ferrite ring wound with a coil to form a toroid. The toroid then surrounds the respective line. Such current sensing gives an accurate, instantaneous measure of the current in the line and provides voltage isolation and current surge isolation. The current sensor module 36 thus preferably includes a current sensor as is known in the art in current sensing relationship with each of the phases of the lines A, B, and C.

The current sensor 36 produces an analog current waveform or signal responsive to the analog power waveform or signal on each of lines A, B and C. The current sensor 36 provides the analog current waveforms to the processing unit 40 via communication lines 48. The multiplexer 41 receives the analog current waveforms and provides the waveforms, one at a time, to the A/D converter 44.

The A/D converter 44 receives the analog current waveforms from the multiplexer 41 and converts (digitizes) each analog current waveform into a digital representation thereof. It should be understood that while the analog-to-digital converter 44 is depicted as a single A/D converter, plural A/D converters may be used, such as one A/D converter for the voltage waveform and one A/D converter for the current waveform.

The A/D converter 44 provides the digitized current signals to the DSP 42 via communication line 50. The DSP 42 receives the digitized voltage waveform and the digitized current waveform from the A/D converter 44 for processing. The digital current and voltage waveforms are processed by the DSP 42 to calculate various quantities such as energy, voltage, and current. These values are used to update other components, software, and hardware such as accumulators, totalizers, and displays.

As well, the DSP 42 processes the digital current waveform to determine if there is a half-wave rectified (DC) load connected to the meter 10. To this end, the DSP 42 executes instructions (e.g. algorithms) stored in a memory 56 to analyze the samples constituting the digital current waveform to determine if a half-wave rectified or direct current (DC) load is coupled to the line/meter. It is noted that the memory 56 may suitably include RAM, ROM, EEPROM, or other memory devices, or a combination thereof.

Exemplary instructions performed by the DSP 42 to analyze the digital current waveform to determine if half-wave rectified load is present are discussed below in connection with FIG. 2 and FIGS. 3A, 3B, and 3C.

The determinations by the DSP 42 are communicated to the microprocessor 12 via communication line 52. If it has been determined that a half-wave rectified load is coupled to the meter 10, the microprocessor 12 provides an indication of the situation via the display 16 or any other means.

In supplying electrical energy, it has been noticed that the load(s) coupled to the meter affects the current waveform in the current sensor when the current sensor is a current transformer. The present current sensor module 36 thus measures a load, active or reactive, coupled to the meter 10. For non-half-wave rectified (AC) loads (i.e. loads that utilize AC power as compared to loads that utilize DC or half-wave rectified power), the analog current waveform produced by the current sensor 36 is typically sinusoidal or substantially symmetric. The sinusoidal current waveform will be essentially symmetric relative to the zero-crossing. Moreover, the absolute value of the peak positive value of the current waveform and the absolute value of the peak negative value of the current waveform are substantially the same. For half-wave rectified (DC) loads, the analog current waveform produced by the current sensor 36 will not be sinusoidal and the waveform will not be symmetric relative to the zero crossing. Likewise, the absolute value of the peak positive value of the analog current waveform and the absolute value of the peak negative value of the analog current waveform will be different.

In operation, the electricity meter 10 utilizes the current sensor module 36 and the voltage sensor module 34 to produce an analog current waveform and an analog voltage waveform respectively. The analog current waveform is a characteristic of the incoming electrical power waveform and the waveform produced by the load (load affects current).

The meter 10 is operable via the components described above to utilize the current signal(s) and the voltage signal(s) from the current sensor module 36 and the voltage sensor module 34 respectively, to perform normal metering operations such as calculating metering information (e.g. energy usage) or the like. This is typically performed, at least in part, by the processing unit 40. The processing unit 40, and in particular the DSP 42, is further operable to detect the presence of a half-wave rectified or DC load using the digital current signals from the A/D converter 44 as converted from the analog current signals produced by the current sensor module 36. To this end, the DSP 42 may suitably carry out the functions of the flow chart 60 of FIG. 2 and/or the flow chart 92 of FIGS. 3A, 3B, and 3C.

Figure 2:
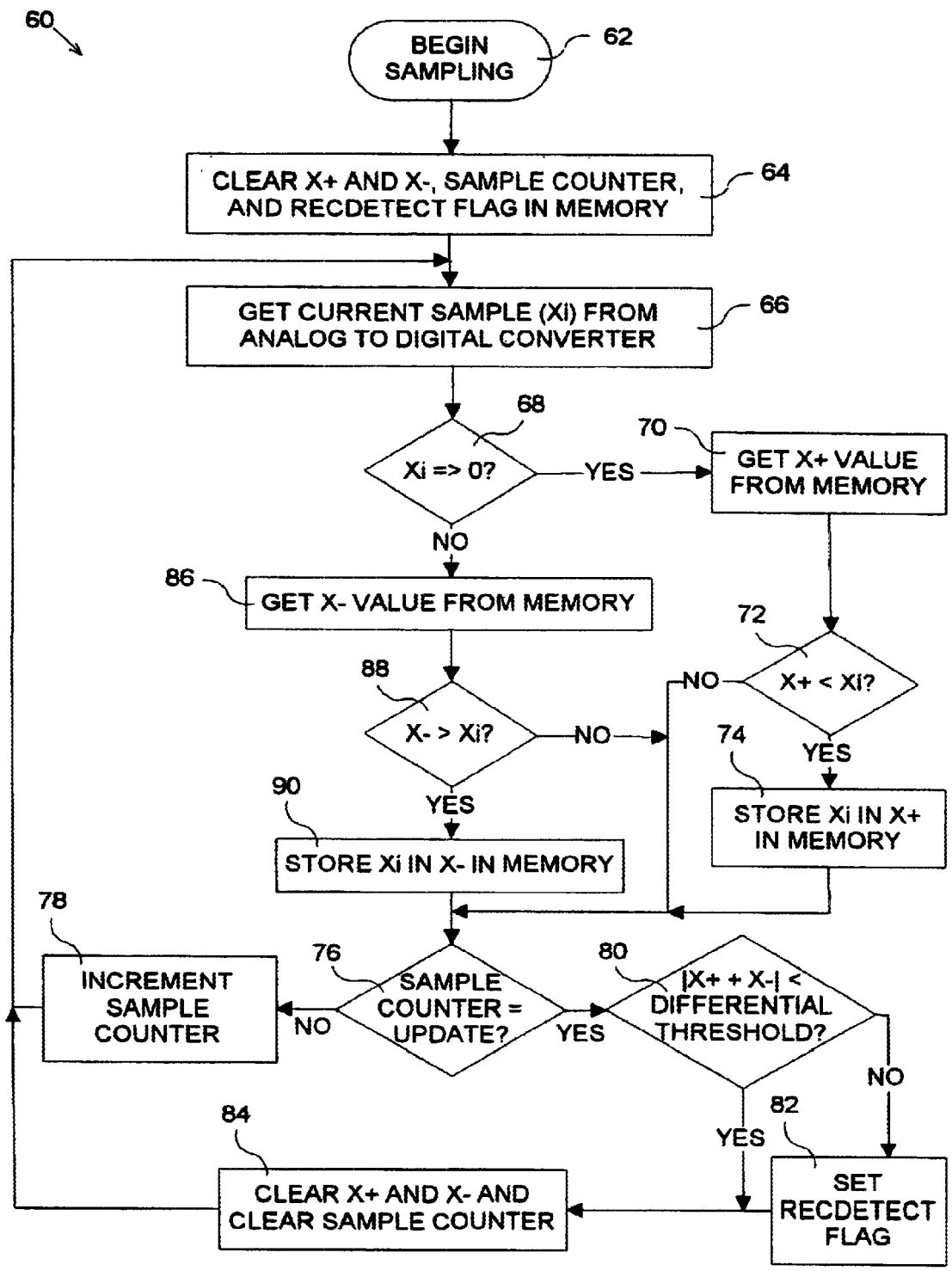
FIG. 2 is flowchart of a procedure for detecting the presence of a rectified load in accordance with an aspect of the present invention.

With reference to FIG. 2, there is shown a flowchart 60 of one method as performed by the DSP 42 for detecting the presence of a half-wave rectified load coupled to the meter 10 from the analog current waveform produced by the current sensor module 36. The method as set forth in the flowchart of FIG. 2 and the following text, thus utilizes the processing module 40 to analyze the analog current waveform as produced by the current sensor module 36. However, it will be noted that in alternative embodiments, some or all of the operations shown in FIG. 2 may be executed by the microcontroller 12 or another processor.

It should be understood that the detection operation as described with reference to FIG. 2 is preferably carried out per phase or per line of the electric power. In the case of three-phase power as shown in FIG. 1, the detection operation is preferably running in triplicate. The detection of a half-wave rectified load is preferably accomplished per line. In the case of single phase electric power, the detection operation as described herein is carried out singly.

In the flowchart 60, Xi is the present digital sample, X+ is the positive peak value, X− is the negative peak value, and RECDETECT is a flag indicating detection of a half-wave rectified load. If RECDETECT is set during the execution of the flowchart 60, then RECDETECT is passed to other components for further processing to communicate or warn of the presence of a half-wave rectified load.

Initially, the DSP 42 begins receiving the digital (sampled) current waveform from the A/D converter 44, step 62. The peak positive current value X+, the peak negative current value X−, the Sample Counter, and the RECDETECT Flag in the memory 56 are all cleared or reset, step 64. The DSP 42 obtains a current sample (Xi) from the A/D converter 44, step 66. In step 68, the current sample Xi is compared against the value zero ("0") to determine if Xi is equal to or greater than zero. If the current sample Xi is greater than or equal to zero, the peak positive current value X+ is retrieved from the memory 56, step 70. The current sample Xi is compared to the peak positive current value X+ to determine if the peak positive current value X+ is less than the current sample Xi (or if the current sample Xi is greater than the peak positive current value X+), step 72. Then, if the current sample value Xi is greater than the peak positive current value X+, the current sample value Xi is stored as the new peak positive current value X+ in the memory 56, step 74. Thereafter, it is determined whether the Sample Counter equals Update, step 76. If, however, in step 72 it is determined that the current sample value Xi is less than the peak positive current value X+, then the DSP 42 proceeds directly to step 76 to determine whether the Sample Counter equals Update, with Update being an arbitrary number.

Returning again to step 68, if the current sample Xi is not equal to or greater than zero (0), then the peak negative value X− is retrieved from the memory 56, step 86. The current sample Xi is compared to the peak negative current value X− to determine if the peak negative current value X− is less than the current sample Xi (or if the current sample Xi is greater than the peak negative current value X−), step 88. If the peak negative value X− is greater than the current value Xi, then the current sample value Xi is stored as the new peak negative current value X− in the memory 56, step 90. Thereafter, it is determined whether the Sample Counter equals Update, step 76. If, however, in step 88 it is determined that the current sample value Xi is greater than the peak negative current value X− then the DSP 42 proceeds directly to step 76 to determine whether the Sample Counter equals Update.

If the Sample Counter equals Update, step 76, then the absolute value of the difference between the peak positive current value X+ and the peak negative current value X− is compared against a Differential Threshold, step 80. Particularly, if the absolute value of the difference between the peak positive current value X+ and the peak negative current value X− is less than the Differential Threshold, then there is no half-wave rectified loading detected and the peak positive current value, X+, the peak negative value X− and the Sample Counter are cleared, step 84. Thereafter, the program returns to step 66. If, however, in step 80 it is determined that the absolute value of the difference between the peak positive current value X+ and the peak negative current value X− is greater than the Differential Threshold, then the RECDETECT flag is set, step 82, indicating the presence of a half-wave rectified load. Thereafter, the peak positive current value, X+, the peak negative value X−, and the Sample Counter are cleared, step 84, and the program returns to step 66.

The value of the Differential Threshold will vary depending on the desired sensitivity of the half-wave rectified load detection operation. However, it is contemplated that the value of the Differential Threshold should be on the order of between 10% and 20% of the value of X+. While lower threshold percentages may be used, it has been found that DC components of loads that cause less than 10% differential between positive and negative peak current values have relatively insignificant effect on the accuracy of current transformer-based meters. As a result, use of a lower threshold would provide little benefit and may undesirably increase the number of false detections requiring further review by utility technicians.

While the algorithm described in connection with FIG. 2 allows for the detection of half-wave rectified loads, noise may be a factor since the positive peak and negative peak values are determined from a single peak reading/sample. Any noise in the reading/sample may result in a reading error. To improve performance of the method of FIG. 2, the DSP 42 and/or the microcontroller 12 may count or accumulate the number of times the RECDTECT flag is set. Then the value of the counter may be periodically checked. If the counter value is low, then it is more likely that the RECDETECT flags may have been caused by noise.

A second approach, described below, does not utilize a single data point representative of the positive peak and another single data point representative of the negative peak, but rather uses a derivative approach. In particular, the algorithm for detecting the presence of a half-wave rectified load presented in conjunction with FIGS. 3A, 3B, and 3C uses several sampled data points of the digital current waveform to develop a summation total for the positive half cycle and a summation total for the negative half cycle that are then compared. Consequently, the decision to set the DC detection flag (RECDETECT) is more immune to noise. In particular, the algorithm first differentiates the current signal, then sums the absolute value of all the differentials in each half cycle to yield two values where one is representative of or proportional to the peak positive value of the current and one is representative of or proportional to the peak negative value of the current. Since most noise is random, the average error due to noise associated with many data samples will tend to be zero.

Noise in the information signal used to determine the presence of DC loads can be caused by several factors. Noise in the current transformer secondary signal can be from such sources as 1) noise on the power line being passed through the current transformer, 2) thermal noise in the analog circuitry used in the current sensing circuit, and 3) Barkhausen noise from pinning of the magnetic domain walls in the magnetic core of the current transformer. Noise can also be introduced by the A/D conversion process due to switching transients, cross talk, or coupled signals from nearby digital circuits. Additionally, noise can be introduced by the calculation process itself due to limited resolution of the digital number, or rounding and truncation errors.

Figure 3A:
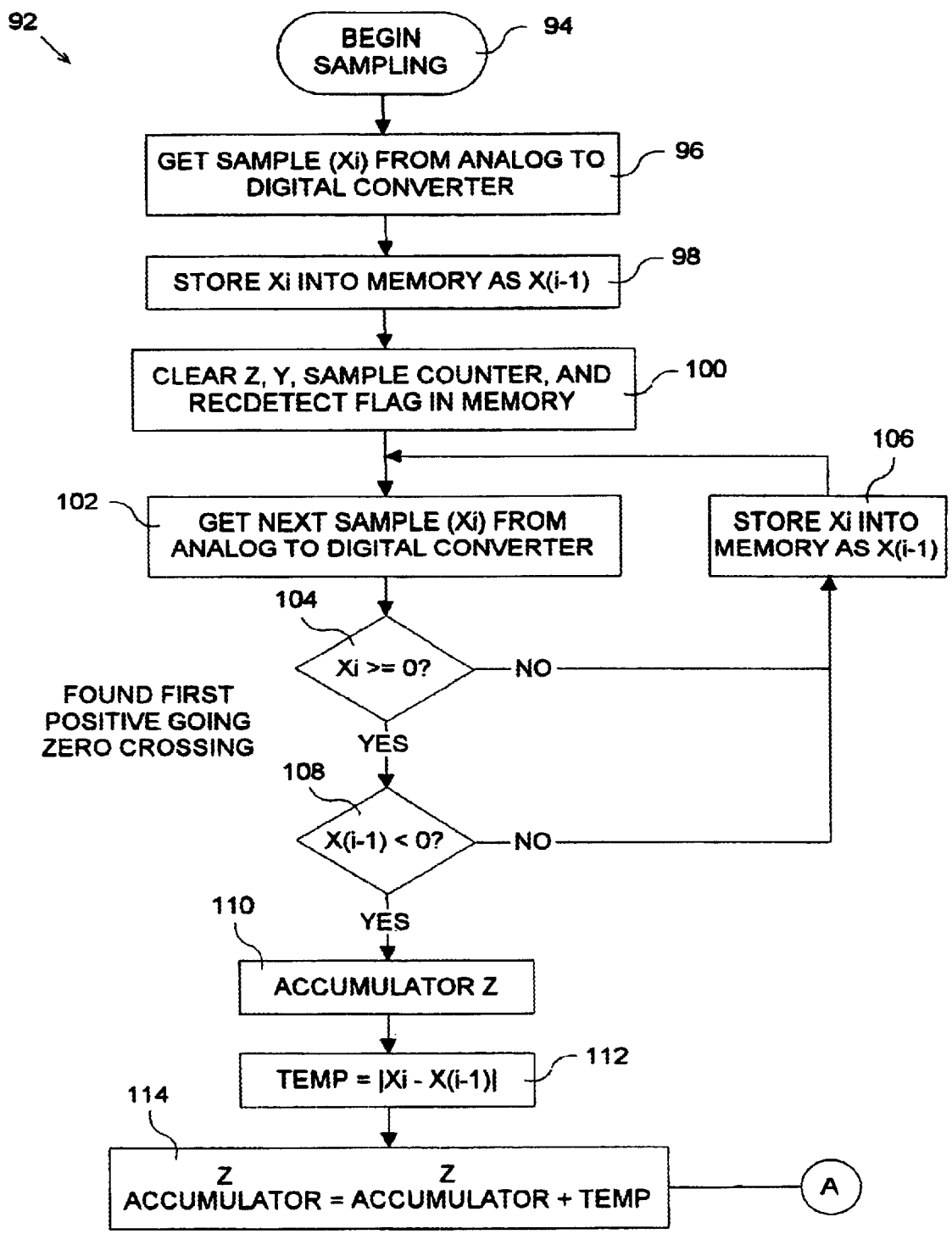
FIGS. 3A, 3B, and 3C comprise, collectively, a flowchart of another procedure for detecting the presence of a rectified load in accordance with an aspect of the present invention.
Figure 3B:
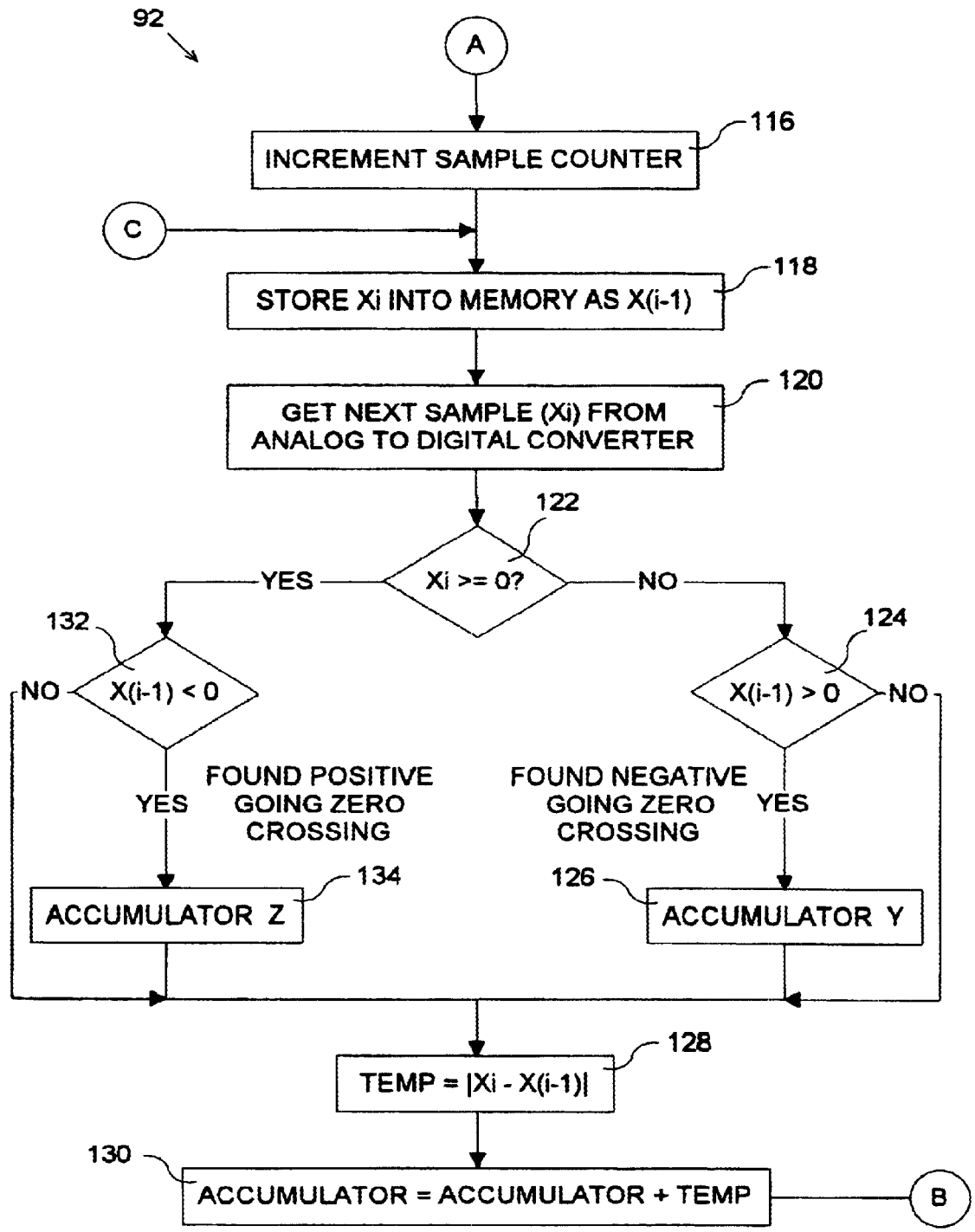
Figure 3C:
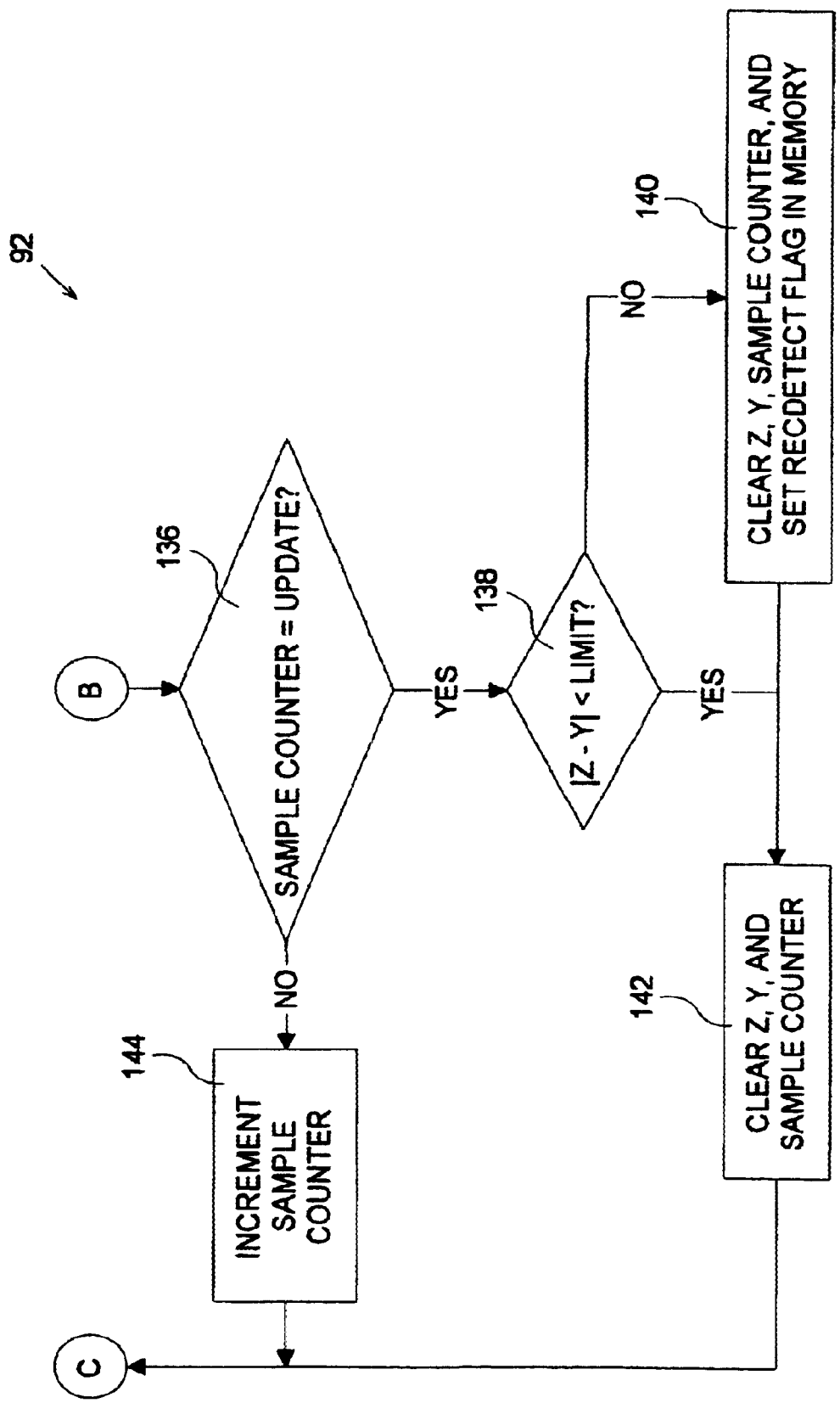

With reference now to FIGS. 3A. 3B, and 3C, there is shown flowchart 92 pertaining to another method as performed by the DSP 42 for detecting the presence of a half-wave rectified load coupled to the meter 10 from the analog current waveform produced by the current sensor module 36. The method as set forth in the flowchart of FIGS. 3A, 3B, and 3C and the following text, thus utilizes the processing module 40 to analyze the analog current waveform as produced by the current sensor module 36. Particularly, the current sensor module 36 is responsive to the energy waveform signal produced by the load(s) under the influence of the incoming (supplied) electrical energy waveform signal. Once the analog current waveform is digitized by the A/D converter 44, the program (DSP) begins sampling, step 94.

Once the A/D converter 44 begins sampling, step 94, the DSP 42 then obtains a current sample Xi from the A/D converter 44, step 96. The current value Xi is stored in the memory 56 as X(i−1), step 98. Thereafter, the DSP 42 clears Z, Y, Sample Counter, and the RECDETECT flag in the memory 56, step 100. The DSP 42 then obtains the next current sample Xi from the A/D converter 44, step 102. This next current value, Xi, is compared with zero to determine whether it is greater than or equal to zero, step 104. If Xi is not greater than or equal to zero, then Xi is stored in the memory 56 as X(i−1), step 106, and the program returns to step 102. If Xi is greater than or equal to zero, step 104, then it is determined whether X(i−1), stored in the memory 56, is less than zero, step 108. If X(i−1) is not less than zero, Xi is stored into the memory 56 as X(i−1), step 106. As before, the program returns to step 102. Should X(i−1) be less than zero in step 108, the Accumulator is set equal to Z, step 110. Thus, the DSP 42 in steps 102, 104, 106, and 108 identifies the first positive going zero crossing of the current waveform.

After the Accumulator is set equal to zero, step 110, TEMP is set equal to the absolute value of Xi−X(i−1), step 112. The Accumulator is thereafter set to equal Accumulator+TEMP, step 114, and the Sample Counter is incremented, step 116. After the Sample Counter is incremented, Xi is stored in the memory 56 as X(i−1), step 118. The DSP 42 then obtains the next current sample Xi from the A/D converter 44, step 120.

This next current value, Xi, is compared to zero, step 122. If Xi is greater than or equal to zero, then it is determined whether X(i−1) is less than zero, step 132. Should X(i−1) be less than zero, the Accumulator is set equal to Z, step 134, and then TEMP is set equal to the absolute value of Xi–X(i–1), step 128. However, if it is determined in step 132 that X(i–1) is not less than zero then the program proceeds directly to step 128. It is noted that the determination that Xi is greater than or equal to zero, step 122, identifies a positive going zero crossing for the current waveform.

If, however, in step 122, it is determined that Xi is not greater than or equal to zero (thus less than zero), then it is determined whether X(i–1) is greater than zero, step 124. If X(i–1) is not greater than zero, then TEMP is set equal to the absolute value of Xi–X(i–1). If X(i–1) is greater than zero, then Accumulator is set equal to Y, step 126. After step 126, TEMP is set equal to the absolute value of Xi–X(i–1), step 128. Thus, it is noted that the determination that Xi is less than zero, step 122, identifies a negative going zero crossing for the current waveform.

After step 128, Accumulator is set equal to Accumulator+TEMP, step 130, and the Sample Counter is compared to Update, step 136. If the Sample Counter is not equal to Update, the Sample Counter is incremented, step 144, and the program returns to step 118. If, however, the Sample Counter is equal to Update, then it is determined whether the absolute value of Z–Y is less than the Limit, step 138.

In step 138, if it is determined that the absolute value of Z–Y is not less than the Limit, then the DSP 42 clears Z, Y, and the Sample Counter, and sets the RECDETECT flag in the memory 56, step 140, indicating that a half-wave rectified load has been detected. Thereafter, the program returns to step 118. If the absolute value of Z–Y is less than the Limit, the DSP 42 only clears Z, Y, and the Sample Counter, step 142, before returning to step 118. In this manner, all of the digital samples of the current waveform are utilized to determine whether a half-wave rectified (DC) load is coupled to the electricity meter.

Thus, FIG. 2 and FIGS. 3A, 3B and 3C show two different sets of operations that may be carried out by a processor in accordance with the present invention to analyze the measured current waveform to determine whether a half-wave rectified load is present. In particular, the two different sets of operations both analyze the current waveform to determine the peak positive and peak negative current values. The peaks are then analyzed to determine whether a DC load component is present. By analyzing the current waveform itself, the present invention likely obtains relatively accurate peak values. By using relatively accurate peak values, the DC load detection analysis is less prone to error.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

For example, the determination of whether a half-wave rectified load is present based on current samples need not be made by a digital signal processor, but may be made by any suitable processor that is capable of being programmed and/or otherwise configured to carry out the operations described herein. Such processor may include microprocessors, digital signal processors, discrete digital logic, microcontrollers, and the like, and/or combination(s) thereof.

What is claimed is:

1. An electric power usage meter adapted to be electrically coupled to an electric power network, the electric power usage meter comprising:
   a current sensor adapted to be in current sensing relationship with the power network and to produce an analog current signal in response to and representative of current in the power network;
   an analog-to-digital converter electrically coupled to said current sensor and adapted to convert the analog current signal into a digital current signal;
   a memory device containing a plurality of instructions;
   a processor electrically coupled to said memory device and to said analog-to-digital converter and adapted to receive the digital current signal from said analog-to-digital converter;
   wherein said processor is operable under control of said plurality of instructions to
      generate a peak positive current value using a plurality of positive digital current signal samples and generate a peak negative current value using a plurality of negative digital current signal samples, and
      detect the presence of a half-wave rectified load coupled to the power network based on said peak positive current value and said peak negative current value.

2. The utility meter of claim 1, wherein said current sensor comprises a current transformer.

3. The utility meter of claim 1, wherein said processor includes a digital signal processor.

4. The utility meter of claim 1, wherein said processor is operable to signify presence of a half-wave rectified load when an absolute value of the peak positive current value is substantially unequal to an absolute value of the peak negative current value.

5. The utility meter of claim 1, wherein said processor is operable to signify the presence of a half-wave rectified load when the difference between the absolute value of the peak positive current value and the absolute value of the peak negative current value is non-zero and greater than a predetermined threshold value.

6. The utility meter of claim 1, wherein the processor is further operable to generate the peak positive current value and the peak negative current value by differentiating the digital current signal.

7. The electric power usage meter of claim 1 wherein the processor is further operable to generate the peak positive current value by performing a processing operation on a first positive digital current sample and a second digital current sample.

8. An arrangement for use in an electrical utility meter, the electrical utility meter operable to be connected to an electric power network, the arrangement operable to detect a half-wave rectified load coupled to the electric power network, the arrangement comprising:
   a) an analog-to-digital converter electrically coupled to said current transformer and adapted to convert an analog current signal to a digital current signal, the analog current signal representative of the current in the electric power network;
   b) a memory device having a plurality of instructions stored therein; and
   c) a processor electrically coupled to said memory device and said analog-to-digital converter and operable under control of the plurality of instructions to
      generate a peak positive current value at least in part by comparing a positive digital current signal sample to a prior positive digital current signal sample and generate a peak negative current value at least in part by comparing a negative digital current signal sample to a prior negative digital current signal sample, and determine whether a half-wave rectified load is coupled to the electric power network using the peak positive current value and the peak negative current value.

9. The utility meter of claim 8, wherein said processor is operable under said plurality of instructions to indicate presence of a half-wave rectified load when an absolute value of the positive peak current value is substantially unequal to an absolute value of the negative peak value.

10. The utility meter of claim 8, wherein said processor is operable under said plurality of instructions to indicate presence of a half-wave rectified load when the difference between the absolute value of the positive peak current value and the absolute value of the negative peak current value is non-zero and greater than a predetermined threshold.

11. The utility meter of claim 10, wherein said processor is further operable to generate the peak positive current value and the peak negative current value by differentiating the digital current signal.

12. In an electric utility meter, the electric utility meter operable to measure power consumption in an electric power network, a method of detecting the presence of a half-wave rectified load coupled to the electric power network, the method comprising:

a) obtaining a current signal, the current signal representative of current in the electric power network;

b) generating a peak positive current value at least in part by comparing a positive digital current signal sample to a prior positive digital current signal sample and generating a peak negative current value at least in part by comparing a negative digital current signal sample to a prior negative digital current signal sample;

c) determining whether a half-wave rectified load is coupled to the electric power network based on the peak positive current value and the peak negative current value; and d) providing an indication of the presence of a half-wave rectified load if it is determined that a half-wave rectified load is coupled to the electric power network.

13. The method of claim 12, wherein step a) further comprises obtaining the current signal using a current transformer.

14. The method of claim 12, wherein step a) further comprises obtaining the current signal as an analog current signal and then employing an analog-to-digital converter to convert the analog current signal to a digital current signal.

15. The method of claim 14 wherein step b) further comprises employing a digital signal processor to generate the peak positive current value and the peak negative current value.

16. The method of claim 15, wherein step c) further comprise employing the digital signal processor to determine whether a half-wave rectified load is coupled to the electric power network.

17. The method of claim 12 wherein step c) further comprises comparing the peak positive current value with the peak negative current value, and determining the presence of the half-wave rectified load when an absolute value of the peak positive current value is substantially unequal to an absolute value of the peak negative current value.

18. The method of claim 12 wherein step c) further comprises comparing the peak positive current value with the peak negative current value, and determining the presence of a half-wave rectified load when the difference between the absolute value of the peak positive current value and the absolute value of the peak negative current value is non-zero and greater than a predetermined threshold value.

* * * * *